(12) United States Patent
Edwards

(10) Patent No.: US 9,100,021 B2
(45) Date of Patent: Aug. 4, 2015

(54) LINEAR CAPACITIVELY COUPLED TOUCH SENSOR AND METHOD

(75) Inventor: Michael W. Edwards, Houston, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 747 days.

(21) Appl. No.: 13/353,933

(22) Filed: Jan. 19, 2012

(65) Prior Publication Data
US 2013/0187704 A1    Jul. 25, 2013

(51) Int. Cl.
H03K 17/96       (2006.01)
G06F 3/0362      (2013.01)
G06F 3/044       (2006.01)

(52) U.S. Cl.
CPC ............ *H03K 17/962* (2013.01); *G06F 3/0362* (2013.01); *G06F 3/044* (2013.01); *H03K 2017/9602* (2013.01); *H03K 2217/96066* (2013.01)

(58) Field of Classification Search
CPC ...... G03F 3/044; G03F 3/0362; H03K 17/962
USPC ............... 324/658–660, 686, 688; 178/18.06, 178/18.01, 18.03; 345/173–174; 327/517
See application file for complete search history.

(56) References Cited

U.S. PATENT DOCUMENTS

| | | | | |
|---|---|---|---|---|
| 4,264,831 A * | 4/1981 | Wern | ............................. | 327/180 |
| 8,415,959 B2 * | 4/2013 | Badaye | ......................... | 324/658 |
| 8,564,565 B2 * | 10/2013 | Westhues | ....................... | 345/173 |
| 8,638,112 B2 * | 1/2014 | Day et al. | ........................ | 324/713 |
| 8,736,563 B2 * | 5/2014 | Noguchi et al. | .............. | 345/173 |
| 8,902,183 B2 * | 12/2014 | Miller et al. | ................... | 345/173 |
| 2006/0049835 A1 * | 3/2006 | Burdick | .......................... | 324/658 |
| 2007/0032967 A1 * | 2/2007 | Feen et al. | ....................... | 702/47 |
| 2008/0251299 A1 * | 10/2008 | Liao et al. | ................... | 178/18.06 |
| 2010/0144391 A1 * | 6/2010 | Chang et al. | ................... | 455/566 |
| 2010/0156839 A1 * | 6/2010 | Ellis | ................................ | 345/174 |
| 2010/0258361 A1 * | 10/2010 | Yamauchi et al. | .......... | 178/18.06 |
| 2010/0295804 A1 * | 11/2010 | Takeuchi et al. | .............. | 345/173 |
| 2011/0062971 A1 * | 3/2011 | Badaye | ........................... | 324/686 |
| 2011/0261005 A1 * | 10/2011 | Joharapurkar et al. | ....... | 345/174 |

(Continued)

OTHER PUBLICATIONS

"The art of capacitive touch sensing", Mark Lee, Cypress Semiconductor Corp., Mar. 1, 2006, 6 pages.

(Continued)

*Primary Examiner* — Matthew Fry
(74) *Attorney, Agent, or Firm* — John R. Pessetto; Charles A. Brill; Frank D. Cimino

(57) ABSTRACT

A system includes a capacitively-coupled touch sensor having a conductive first layer and a conductive second layer on a first insulative layer. The width of the second layer varies along an axis of the first layer. A first excitation signal is applied to one of the first and second layers and is capacitively coupled through a touch element to the other layer, producing a first signal that produces a second signal which is digitized. Digitized peak values of the second signal are processed to compute a value for a touch element location. A conductive third layer can be placed on the opposite side of the first layer has width varying oppositely to the second layer. The first excitation signal is applied to the second layer and a non-overlapping second excitation signal is applied to the third layer. The resulting digitized peak values are processed to cancel errors due to variations.

10 Claims, 5 Drawing Sheets

(56) References Cited

U.S. PATENT DOCUMENTS

| | | | |
|---|---|---|---|
| 2012/0223911 A1* | 9/2012 | Westhues | 345/174 |
| 2012/0249460 A1* | 10/2012 | Mizutani et al. | 345/173 |
| 2013/0241873 A1* | 9/2013 | Kim et al. | 345/174 |

OTHER PUBLICATIONS

"Touch Sensor Controller Technology and Application Trends", Fujitsu Technology Backgrounder, Fujitsu Microelectronics America, Inc., 2009, pp. 1-10.

"FMA1127 Touch Sensor Controller", Fujitsu Spec Sheet, Fujitsu Microelectronics America, Inc., 2009, 32 pages.

"PCB-Based Capacitive Touch Sensing With MSP430", Texas Instruments Application Report, Texas Instruments Incorporated, Jun. 2007, Revised Oct. 2007, pp. 1-25.

"Capacitive Tough Sensors, Application Fields, technology overview and implementation example", Dirk Fischer, Fujitsu Microelectronics Europe GmbH, pp. 1-12.

* cited by examiner

LINEAR CAPACITIVELY COUPLED TOUCH SENSOR AND METHOD

BACKGROUND OF THE INVENTION

The present invention relates generally to capacitively-coupled touch sensors, and more particularly to capacitively-coupled "slider" sensors which respond to touch by generating a linear output signal relative to the position of a user's finger as it slides along the surface of a touch sensor. The invention relates still more particularly to such a linear capacitively-coupled touch sensor that is essentially independent of variations in finger pressure and various other "environmental" variables.

Capacitively-coupled touch sensors are well understood, and are becoming widely used in modern electronics to replace mechanical switches as input devices for command and control functions. In many common applications, an individual touch sensor performs a single function such as turning a lamp on or off. In previous designs, multiple individual capacitively-coupled touch sensors with digital outputs have been positioned side-by-side and utilized in conjunction with a microprocessor or the like that performs an interpolation process in order to compute a linear value indicating the present location of a user's finger touch. The interpolation technique typically requires use of at least 5 to 7 individual capacitively-coupled sensors to implement the foregoing "pseudo-linear" functionality.

Unfortunately, the use of multiple individual capacitively-coupled touch sensors and interpolation techniques as indicated above to provide pseudo-linear functionality may be too complex and costly for use in a modern laptop computer or other electronic device in which available space for switches and the like is at a premium. Furthermore, there are many other applications that include a row of individual capacitively-coupled touch sensors located side-by-side wherein it would be advantageous to be able to provide a linear output signal precisely indicating the user's finger touch location within the field of the individual capacitively-coupled touch sensors without the complexity and cost of performing such interpolation processes.

If a linear capacitively-coupled touch sensor which minimizes the number of leads required to integrate the function were available to be integrated in a die on which available area is at a premium, such a touch sensor could be advantageously utilized in various electronic devices. This would allow flexibility in the definition of switch functions in future designs of laptop computers and various other electronic devices. For example, the locations of discrete boundaries or "hot zones" of the individual inputs could be defined by silkscreen boundaries on external protective covering material. The linear positions of finger touch could determine various functions intended to be activated/deactivated under firmware control by touching various corresponding touch locations of a such a capacitively-coupled linear touch sensor.

FIG. 1 shows a plausible capacitively-coupled touch sensor system 10-1 which is believed to be novel. Capacitively-coupled sensor system 10-1 includes a capacitively-coupled touch sensor 4-1 which is sensitive to the linear position of a user's finger 19. When a signal source 7 applies a signal that is rich in harmonic content to a conductive center element or "plate" 2, the resulting signal is capacitively coupled from center plate 2 to outer plate 3 and generates a signal V6 that is developed across a load resistor $R_{LOAD}$ and is provided as an input to an amplifier 8. The amplifier may also perform some signal conditioning to remove unwanted noise or otherwise undesirable variations. A peak detector 12 detects a signal V9 generated on amplifier output 9 and generates a corresponding peak signal V13 of peak detector output 13. An ADC (analog-to-digital converter) 15 converts the analog signal V13 to a corresponding digital output signal $D_{OUT}$ on digital bus 17. A suitable processor (not shown) can process the digital information and compute a value along the x axis that represents the position at which finger 19 touches touch sensor 4-1.

In order to vary the capacitive coupling relative to finger touch position, finger 19 in effect becomes another capacitor plate of touch sensor 4-2. The effective area of the outer plate 3 involved in capacitive coupling with finger 19 increases as the finger touch position moves left to right along the x axis. Consequently, as the touch of finger 19 moves from left to right in FIG. 1, the effective capacitive coupling between outer plate 3 and inner plate 2 is proportional to the finger touch position along the x axis.

Unfortunately, the capacitive coupling is significantly affected by the above-mentioned variations in the touch pressure of Finger 19 (and also by variations in some other "environmental" parameters, such as humidity and user skin conductivity).

When finger 19 is positioned to the extreme left in the x direction along the longitudinal axis of inner conductive layer or plate 2, there is minimal capacitive coupling between outer conductive layer or plate 3 and inner conductive layer or plate 2. As finger 19 slides to the right, the capacitance or capacitive coupling between outer plate 3 (which includes continuous sections 3A, 3B, and 3C) and inner plate 2 increases because the amount of area of outer plate 3 being influenced by the presence of finger 19 increases. Consequently, the capacitive coupling between inner plate 2 and portions 3A and 3B of outer plate 3 increases as a function of finger position in the x direction. (To minimize unwanted variation of coupling when the finger 19 moves in the y direction, the geometry of inner conductive layer or plate 2 is minimized along with the separating gap.)

If the position of finger 19 moves slightly in the z (vertical) direction, and if the associated finger touch pressure is not maintained constant, then the amount of capacitive coupling between outer plate 3 and inner plate 2 increases if the finger pressure is increased and decreases if the finger pressure is decreased. This modifies the values of the signals V6, V9, V13, and $D_{OUT}$ in FIG. 1. The effect of variation of the finger pressure on the amount of the capacitive coupling between outer plate 3 and inner plate 2 ordinarily would be undesirable because such variation causes the determination of the present finger touch location to be inaccurate.

Therefore, it would be highly desirable to have a linear, capacitively-coupled touch sensor method and structure for eliminating the effect of finger pressure (and also various environmental variables) on the amplitude of the output signal $V_{OUT}$ produced in response to touch sensor 4-1. It also would be desirable to provide a capacitively-coupled touch sensor capable of functioning as a linear control switch or "slider" switch so as to provide an accurate linear output signal representative of the location of a user's finger touch without resorting to discrete sensors and mathematical interpolation.

Thus, there is an unmet need for a capacitively-coupled touch sensor and method capable of functioning as a linear control switch or "slider" switch in order to provide a linear output signal representative of the location of a user's finger touch.

There also is an unmet need for a capacitively-coupled touch sensor capable of functioning as a linear control switch or "slider" switch in order to provide an accurate linear output signal representative of the location of a user's finger touch without the complexity and cost of discrete sensors and performing mathematical interpolation of signals generated by those sensors.

There also is an unmet need for a capacitively-coupled touch sensor capable of functioning as a linear control switch or "slider" switch in which an output signal representative of the present location of the user's finger touch is independent of variations in finger touch pressure.

There also is an unmet need for a capacitively-coupled touch sensor capable of functioning as a linear control switch or "slider" switch in which an output signal representative of the present location of the user's finger touch is independent of variations in finger touch pressure and is also independent of variations in various environmental parameters.

SUMMARY OF THE INVENTION

It is an object of the invention to provide a capacitively-coupled touch sensor and method capable of functioning as a linear control switch or "slider" switch in order to provide a linear output signal representative of the location of a user's finger touch.

It is another object of the invention to provide a capacitively-coupled touch sensor and method capable of functioning as a linear control switch or "slider" switch in order to provide an accurate linear output signal representative of the location of a user's finger touch without the complexity and cost of discrete sensors and the need for performing mathematical interpolation of signals produced by such sensors.

It is another object of the invention to provide a capacitively-coupled touch sensor and method capable of functioning as a linear control switch or "slider" switch in which an output signal representative of the present location of the user's finger touch is independent of variations in finger touch pressure.

It is another object of the invention to provide a capacitively-coupled touch sensor and method capable of functioning as a linear control switch or "slider" switch in which an output signal representative of the present location of the user's finger touch is independent of variations in finger touch pressure and also is independent of other environmental conditions such as skin conductivity and humidity.

Briefly described, and in accordance with one embodiment, the present invention provides a touch sensing system (10-2) including a capacitively-coupled touch sensor (4-2) having a conductive first layer (2) and an adjacent conductive second layer (3A) on a first insulative layer (1). The width of the second layer varies along an axis of the first layer. A first excitation signal (V1) is applied to one of the first and second layers and is capacitively coupled through a touch element (19) to the other layer, producing thereon a first signal (V6) that is amplified to produce a second signal (V9) which is digitized. Digitized peak values of the second signal are processed to compute a value (X) representative of a location of the touch element (19). In one embodiment, a conductive third layer (3B) on the opposite side of the first layer has width varying oppositely to that of the second layer. The first excitation signal is applied to the second layer and a non-overlapping second excitation signal (V2) is applied to the third layer. The resulting digitized peak values are processed to cancel errors due to variations in touch element pressure and environmental parameters.

In one embodiment, the invention provides a touch sensing system (10-2) including a capacitively-coupled touch sensor (4-2) including a first conductive layer (2) disposed on a first insulative layer (1) and having a generally uniform width along an axis, and a second conductive layer (3A) disposed on the first insulative layer (1) with a generally non-uniform width that varies progressively along a first direction of the axis, a first edge of the first conductive layer (2) being spaced from the second conductive layer (3A) by a first narrow gap. Stimulus circuitry (7,30) applies a first excitation signal (V1) to a first one of the first (2) and second (3A) conductive layers. First circuitry (8,12) amplifies a first signal (V6) capacitively coupled through a touch element (19) from one of the first (2) and second (3A) conductive layers to another of the first (2) and second (3A) conductive layers to produce an amplified signal (V9). Second circuitry (32) processes digitized peak values of the amplified signal (V9) to compute a value (X) representative of a location of the touch element (19) generally along the axis. In one embodiment, at least a portion of the axis is straight line. In one embodiment, the first circuitry (8,12) also performs a signal conditioning function. In the described embodiments, a second insulative layer (5) disposed over the first (2) and second (3A) conductive layers provides a touch surface.

In one embodiment, the width of the second conductive layer (3A) increases progressively along the first direction of the axis. A third conductive layer (3B) is disposed on the first insulative layer (1) and has a generally non-uniform width that progressively decreases along the first direction of the axis. A second edge of the first conductive layer (2) opposite to its first edge is spaced from the third conductive layer (3B) by a second narrow gap. The stimulus circuitry (30) applies the first excitation signal (V1) to the second (3A) conductive layer and also applies a second excitation signal (V2) to the third conductive layer (3B).

In a described embodiment, the first circuitry (8,12) includes an analog-to-digital converter (15) for digitizing the amplified signal (V9).

In a described embodiment, the first (V1) and second (V2) excitation signal signals are non-overlapping signals, and each of the first (V1) and second (V2) excitation signal signals consists of a plurality of bursts of pulses.

In one embodiment, the touch element is a tip of a user's finger (19), and the second circuitry (15,32) executes an algorithm which averages portions of the digitized peak values, determines variations ($\Delta P$) in the digitized peak values caused by variations in pressure of the user's finger (19), cancels the variations ($\Delta P$) in the digitized peak values caused by the variations in finger pressure ($\Delta P$), and computes a ratio (X) representative of a present location of the tip of the user's finger (19).

In one embodiment, the touch sensing system includes a peak detector (12) for detecting peaks of the amplified signal (V9) produced in response to the first (V1) and second (V2) excitation signals and an analog-to-digital converter (15) for digitizing the detected peaks corresponding to the first (V1) and second (V2) excitation signals. The second circuitry (32) processes the digitized detected peaks by sampling (51) the digitized peak values corresponding to the first excitation signal (V1) a predetermined number (N) of times and sampling (51) the digitized peak values corresponding to the first excitation signal (V1) the predetermined number (N) of times; removing or saturating (53) large-deviation samples from the sampled digitized peak values; determining (54) a short term average of the sampled digitized peak values corresponding to each of the first (V1) and second (V2) excitation signals, respectively; determining (55) an amount of variation ($\Delta P$) in the short term averages over a predetermined interval; averaging (60) the short-term average of the sampled peak values corresponding to the first (V1) and second (V2) excitation signals into a long-term touch average if a present touch is active; and computing (63) the value (X) representative of a location of the touch element (19) generally along the axis. In one embodiment, the second circuitry (32) processes the digitized detected peaks by comparing (56) the short term average of the sampled digitized peak values to a predetermined touch threshold to determine if the present touch is active, and if the present touch is active, then determining (61) new touch thresholds based on the long-term touch average, and removing (62) the long-term non-touch average and one half of the variation ($\Delta P$) from the short-term average. If the present touch is not active, the second circuitry (32) processes the digitized detected peaks by averaging (58) the short term average of the sampled peak values corresponding to the first (V1) and second (V2) excitation signals into a long-term non-touch average.

In one embodiment, the first conductive layer (2) includes first (2-1), second (2-2), and third (2-3) third sections each having a first edge and an opposite second edge. Third (3A), fourth (27B), and fifth (3B) conductive layers are disposed on the first insulative layer (1) along the first conductive layer (2) and have generally non-uniform widths that vary progressively along the axis. The second conductive layer (27A) is spaced by the first narrow gap from the second edge of the first section (2-1). The third conductive layer (3A) is spaced by a second narrow gap from the second edge of the first section (2-1) and has a width that varies oppositely to the width of the second conductive layer (27A). The third conductive layer (3A) is spaced from the first edge of the second section (2-2) by a third narrow gap. The fourth conductive layer (27B) is spaced by a fourth narrow gap from the first edge of the second section (2-2) and has a width that varies oppositely to the width of the third conductive layer (3A) along the third narrow gap. The fifth conductive layer (3B) is spaced by a fifth narrow gap from the second edge of the third section (2-3). The fourth conductive layer (27B) is spaced by a sixth narrow gap from the second edge of the third section (2-3) and has a width that varies oppositely to the width of the fifth conductive layer (3B) along the fifth narrow gap. The stimulus circuitry (30A) applies the first excitation signal (V1) to the second conductive layer (27A), applies a second excitation signal (V2) to the third conductive layer (3A), applies a third excitation signal (V3) to the fourth conductive layer (27B), and applies a fourth excitation signal (V4) to the fifth conductive layer (3B), the first, second, third, and fourth excitation signals being non-overlapping.

In one embodiment, the first conductive layer (2) includes a fourth section (2-4) having a first edge and an opposite second edge. The touch sensing system includes a sixth conductive layer (27C). The fifth conductive layer (3B) is spaced by a seventh narrow gap from the first edge of the fourth section (2-4). The sixth conductive layer (27B) is spaced by an eighth narrow gap from the second edge of the fourth section (2-4) and has a width that varies oppositely to the width of the fifth conductive layer (3B) along the seventh narrow gap. The stimulus circuitry (30A) applies the first excitation signal (V1) to the sixth conductive layer (27A).

In one embodiment, the invention provides a method for operating a touch sensing system (10-2), including providing a capacitively-coupled touch sensor (4-2) including a first conductive layer (2) disposed on a first insulative layer (1) and having an axis and a second conductive layer (3A) disposed on the first insulative layer (1) and having a generally non-uniform width that varies progressively along a first direction of the axis, a first edge of the first conductive layer (2) being spaced from the second conductive layer (3A) by a first narrow gap; applying a first excitation signal (V1) to a first one of the first (2) and second (3A) conductive layers; amplifying a first signal (V6) capacitively coupled through a touch element (19) from the first one of the first (2) and second (3A) conductive layers to a second one of the first (2) and second (3A) conductive layers to produce an amplified signal (V9); and processing digitized peak values of the amplified signal (V9) to compute a value (X) representative of a location of the touch element (19) along the axis.

In one embodiment, the method provides a third conductive layer (3B) disposed on the first insulative layer (1) and having a generally non-uniform width that varies oppositely to the second conductive layer (3A) along the first direction of the axis. A clock off second edge of the first conductive layer (2) opposite to the first edge thereof is spaced from the third conductive layer (3B) by a second narrow gap. The method includes applying the first excitation signal (V1) to the second (3A) conductive layer and also applying a second excitation signal (V2) to the third conductive layer (3B), wherein the second direction is opposite to the first direction, and wherein the first (V1) and second (V2) excitation signals are non-overlapping signals, and wherein each of the first (V1) and second (V2) excitation signals consists of a plurality of bursts of pulses.

In one embodiment, the method includes sampling (51) the digitized peak values corresponding to the first excitation signal (V1) a predetermined number (N) of times and sampling (51) the digitized peak values corresponding to the second excitation signal (V2) the predetermined number (N) of times; removing or saturating (53) large-deviation samples from the sampled digitized peak values; determining (54) a short term average of the sampled digitized peak values corresponding to each of the first (V1) and second (V2) excitation signals, respectively; determining (55) an amount of variation ($\Delta P$) in finger pressure on a second insulative layer (5) over the first (2), second (3A), and third (3B) conductive layers; averaging (60) the short-term average of the sampled peak values corresponding to the first (V1) and second (V2) excitation signals into a long-term touch average if a present touch is active; and computing (63) the value (X) representative of a location of the touch element (19) generally along the axis.

In one embodiment, the invention provides a touch sensing system (10-2) including a capacitively-coupled touch sensor (4-2) including a first conductive layer (2) disposed on a first insulative layer (1) and having an axis and a second conductive layer (3A) disposed on the first insulative layer (1) and having a generally non-uniform width that varies progressively along a first direction of the axis, a first edge of the first conductive layer (2) being spaced from the second conductive layer (3A) by a first narrow gap; means (7,30) for applying a first excitation signal (V1) to a first one of the first (2) and second (3A) conductive layers; means (8) for amplifying a first signal (V6) capacitively coupled through a touch element (19) from the first one of the first (2) and second (3A) conductive layers to a second one of the first (2) and second (3A) conductive layers to produce an amplified signal (V9); and means (12,15,32) for processing digitized peak values of the amplified signal (V9) to compute a value (X) representative of a location of the touch element (19) along the axis. In one embodiment, the touch sensing system includes a third conductive layer (3B) disposed on the first insulative layer (1) and having a generally non-uniform width that varies oppositely to the second conductive layer (3A) along the first direction of the axis, a second edge of the first conductive layer (2) opposite to the first edge thereof being spaced from the third conductive layer (3B) by a second narrow gap, and means (31,32) for applying the first excitation signal (V1) to the second (3A) conductive layer and also applying a second excitation signal (V2) to the third conductive layer (3B), wherein the second direction is opposite to the first direction, and wherein the first (V1) and second (V2) excitation signals are non-overlapping signals, and wherein each of the first (V1) and second (V2) excitation signals consists of a plurality of bursts of pulses.

DETAILED DESCRIPTION OF THE PREFERRED EMBODIMENTS

A preferred embodiment of the invention includes a capacitively-coupled touch sensor device that provides capacitive coupling between capacitive plates, especially between plates in which the capacitive coupling is continuously, linearly proportional to the location of a user's finger touch as it moves along an insulative touch surface disposed on or over the capacitive plate or plates. The effects of finger touch pressure variations (and the effects of variations in certain other "environmental" parameters such as humidity or skin conductivity) are automatically canceled so they do not affect the amplitude of a linear output signal that represents the location of the finger touch on the touch surface.

Figure 2A:
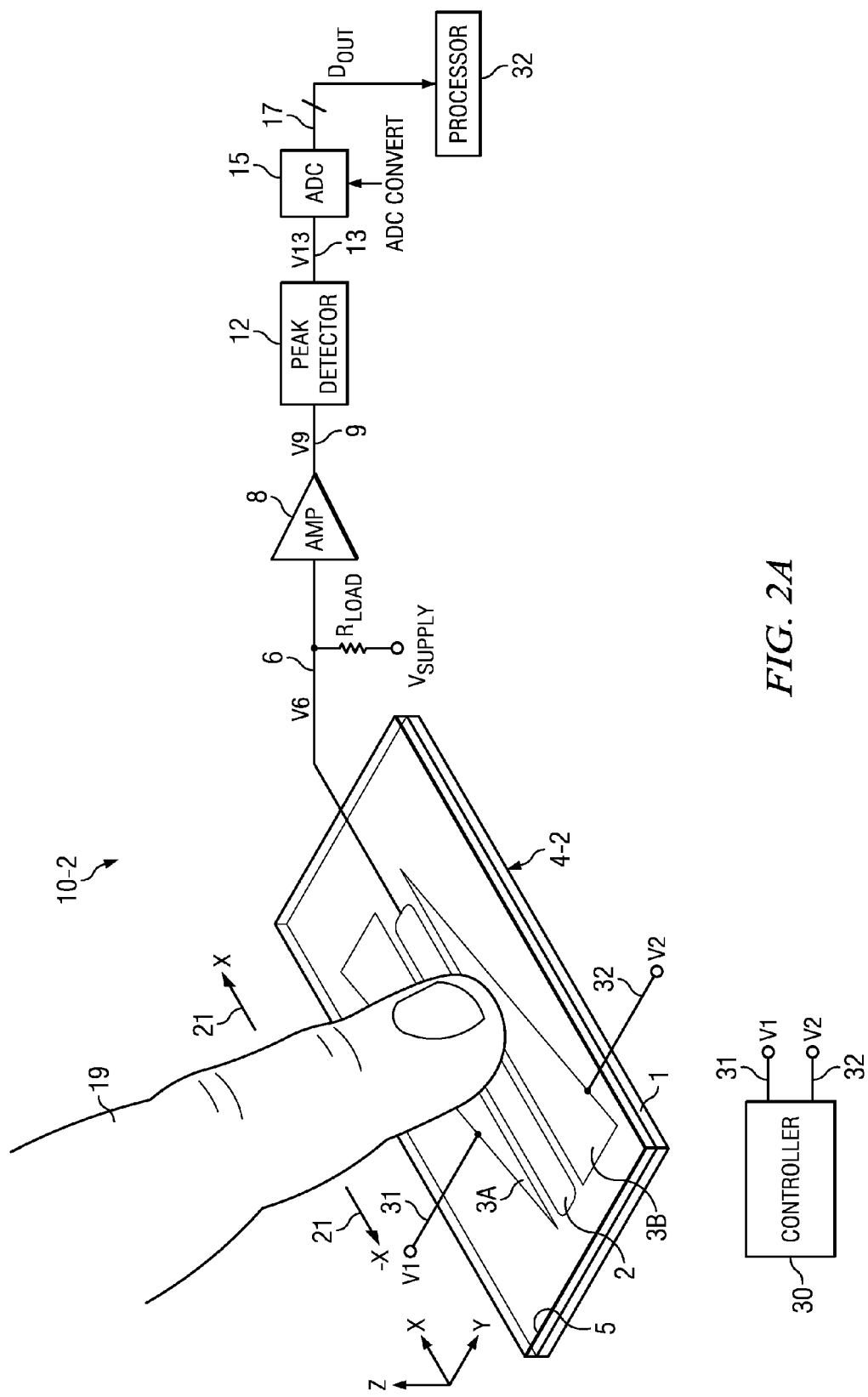
FIG. 2A is a diagram of one embodiment of a linear capacitively-coupled touch sensor system of the present invention.

FIG. 2A shows a capacitively-coupled touch sensor system 10-2 that eliminates the effect of variations in finger touch pressure on the amplitude of an output signal that represents the finger touch location. In FIG. 2A, system 10-2 includes a capacitively-coupled touch sensor 4-2 which includes a triangular capacitive plate 3A, a substantially similar, but oppositely oriented, triangular capacitive plate 3B, and an elongated center plate 2. That is, plates 3A and 3B are symmetrically, oppositely aligned along opposite edges of center plate 2, respectively. The longitudinal axis of center plate 2 is aligned with an x axis, as illustrated. Each of plates 3A and 3B is spaced from center plate 2 by a corresponding narrow gap. Plates 2, 3A, and 3B are disposed on a suitable insulative substrate 1, and are covered by a suitable insulative layer 5, the top surface of which is the touch surface of touch sensor 4-2.

Figure 2B:
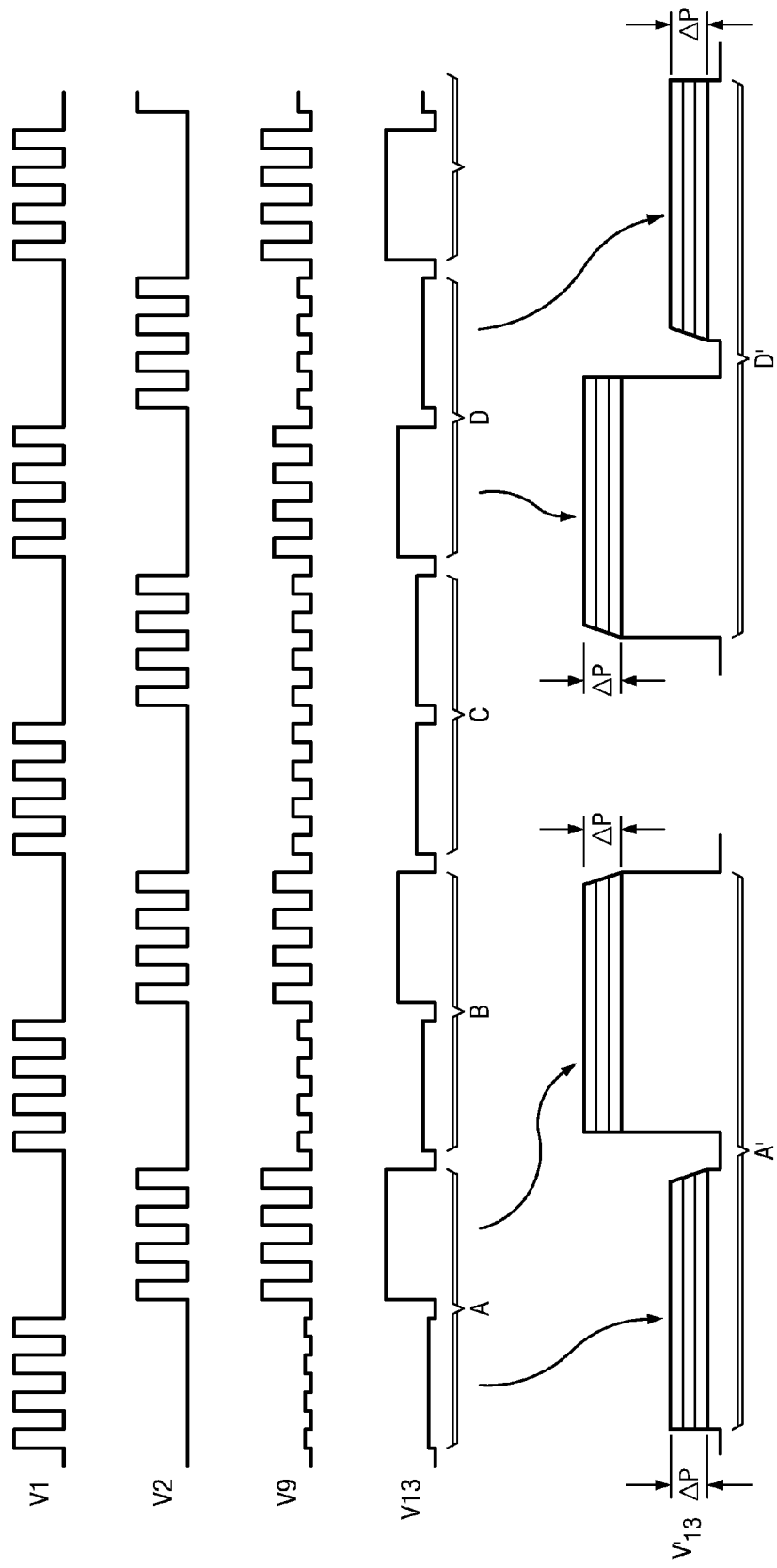
FIG. 2B is a timing diagram including waveforms useful in describing the operation of the touch sensor system of FIG. 2A.

A controller 30 generates a first excitation signal V1 on a conductor 31 that is connected to plate 3A, and also generates a second non-overlapping excitation signal V2 on a conductor 32 that is connected to plate 3B. Thus, outer plates 3A and 3B are separately excited with two different non-overlapping excitation signals V1 and V2, which are shown in FIG. 2B.

As the tip of a user's finger 19 slides in either direction along the surface of insulative layer 5 from one end to the other along the longitudinal axis of center plate 2 of touch sensor 4-2 (i.e., along its x axis), the amount of capacitive coupling from a first one of plates 3A and 3B (depending on the direction of movement of finger 19) to center plate 2 increases as the width of the first plate increases. Simultaneously, the amount of capacitive coupling from the second plate decreases as its width decreases. With the finger touch located over the left end of center plate 2, there is minimal capacitive coupling between center plate 2 and outer plate 3A and maximum capacitive coupling between center plate 2 and outer plate 3B. Conversely, at the right end of center plate 2, there is minimal capacitive coupling between center plate 2 and outer plate 3B and maximum capacitive coupling between center plate 2 and outer plate 3A.

Thus, the amount of capacitive coupling of each of non-overlapping excitation signals V1 and V2 to center plate 2 is different for each value of x at which finger 19 touches the surface of insulative layer 5 (except for one center position along the x axis at which the capacitive coupling to center plate 2 from each of transmitting plates 3A and 3B is identical).

Center plate 2 is connected by conductor 6 to one terminal of resistor $R_{LOAD}$ and to the input of amplifier 8. The signal V6 is produced on conductor 6 as a result of capacitive coupling of excitation signals V1 and V2 onto center plate 2. Amplifier 8 amplifies and otherwise conditions the signal V6 to produce a signal V9 which is applied by conductor 9 to one input of a conventional peak detector circuit 12. (For example, amplifier 8 may include a bandpass filter that selectively amplifies and attenuates signals of interest.) Peak detector circuit 12 produces a detected peak signal V13, which is applied by conductor 13 to the input of an ADC (analog-to-converter) 15. During the excitation pulse trains of non-overlapping excitation signals V1 and V2, ADC 15 is commanded to produce a digital output signal $D_{OUT}$ on bus 17 which represents peak values of the pulse train envelopes of excitation signals V1 and V2. Digital processor 32 then uses the results of the ADC conversion along with the results of a subsequent conversion to ratiometricly calculate the x position of the touch point of finger 19.

Outer plates 3A and 3B can be thought of as "transmitting" plates. Capacitive coupling between outer plates 3A and 3B is received by center plate 2, which can be thought of as a "receiving" plate. Only excitation signal V1 is capacitively coupled from outer plate 3A to center plate 2 during the periodic pulses or bursts of pulses of excitation signal V1. Similarly, only excitation signal V2 is capacitively coupled from outer plate 3B to center plate 2 during the periodic pulses or bursts of pulses of excitation signal V2. By alternately applying pulses or short bursts of pulses of excitation signals V1 and V2 to plates 3A and 3B, respectively, a ratio X of the amount of capacitive coupling between outer plate 3A and center plate 2 divided by the amount of capacitive coupling between outer plate 3B and center plate 2 can be readily calculated by processor 32 to determine the present finger touch location.

FIG. 2B is a timing diagram that is useful in describing the operation of the touch sensor system of FIG. 2A. The illustrated waveforms include the V1 and V2 waveforms generated by controller 30 in FIG. 2A, the amplified waveform V9 generated by amplifier 8 on conductor 9, and the detected peak waveform V 13 generated by peak detector 12 on conductor 13. During each signal burst a sample is collected by processor 30. However, several samples may be taken and averaged during the V1 and V2 signal bursts to reduce noise and other signal variations. The V13' waveform in FIG. 2B includes exaggerated replicas A' and D' of the two pulses A and the two pulses D of the V 13 waveform, to illustrate the effect of a finger touch pressure variation ΔP on the detected peak waveform V 13. The multiple lines at the tops of the pulses of V 13 represent the finger pressure variations ΔP, and also include components that represent additional "environmental" information, including noise and parameter variations due to the physical structure of the sensor device. However, the position variable x is an independent variable and can be extracted from the ratio X of the two signal amplitudes, as subsequently explained with reference to FIG. 4.

The number of pulses in each of the bursts of excitation signals V1 and V2 may depend on the amount of time required for the output of amplifier 8 to settle, the amount of time required for peak detector 12 to stabilize, and the amount of time required for ADC 15 to digitize the analog output V13 of peak detector 12. The period of V13, including the delay between the bursts of excitation signals V1 and V2, may be roughly 10-15 milliseconds.

The two excitation signals V1 and V2 applied to sensor 4-2 in FIG. 2A as alternate, non-overlapping square wave pulses or bursts of pulses are rich in harmonic content. The high frequency content of excitation signal V1 applied to outer plate 3A couples energy into center plate 2 through the capacitances of those two plates, and similarly for excitation signal V2 and plates 2 and 3B. (As the harmonic content of the excitation signal increases, more energy is transferred from outer plates 3A and 3B to center plate 2 as the user's finger 19 is introduced into the electric field between the outer plates 3A and 3B.

Sliding finger 19 on touch surface 5 along the x axis from the left end of sensor 4-2 to the right end results in the capacitive coupling between plates 3A and 2 being increased proportionally to the increasing width of outer plate 3A, and hence to the x position of the touch point of finger 19. Conversely, sliding finger 19 on touch surface 5 along the x axis from right to left results in the capacitive coupling between plates 3A and 2 being decreased proportionally to the decreasing width of outer plate 3A and the decreasing x position of finger 19.

Similarly, sliding finger 19 on touch surface 5 along the x axis from the left end of sensor 4-2 to the right end results in the capacitive coupling between plates 3B and 2 being decreased proportionally to the decreasing width of outer plate 3B and the increasing x position of finger 19, and conversely, sliding finger 19 on touch surface 5 along the x axis from right to left results in the capacitive coupling between plates 3B and 2 being increased proportionally to the increasing width of outer plate 3B with the decreasing x position of finger 19.

The "receiving circuitry" of sensor system 10-2 includes amplifier 8, peak detector 12, and ADC 15. Amplifier 8 amplifies and otherwise conditions the signal V6 produced on conductor 6 by center plate 2, detects the peak value of V9 during each alternate non-overlapping phase of excitation signals V1 and V2, respectively, by means of peak detector 12 and ADC 15 converts each peak value to a digital value. Processor 32 then can store the detected peak magnitudes and use them to perform the algorithm indicated in FIG. 4 so as to eliminate the effects of variations in finger pressure (and certain other parameters) that affect the digitized peak values and also compute the above-mentioned ratio X which represents the value of x that represents the present finger touch location.

The effect of finger touch pressure on the accuracy of the value of x of the present finger touch location is described next. It should be noted that as the finger touch pressure increases, the location of finger 19 along a z axis (which is perpendicular to touch surface 5) may very slightly, and therefore cause the shape and size of the portion of the tip of finger 19 at the touch surface to increase slightly. This causes the capacitive coupling caused by finger 19 to increase. Similarly, as the touch pressure of finger 19 decreases, the capacitive coupling caused by finger 19 also decreases.

Processor 32 of FIG. 2A operates to perform computations which (1) compute suitable averages of peak amplitudes of the pulses or bursts of pulses of excitation signals V1 and V2, (2) determine changes in the averaged peak amplitudes of the pulses or bursts of pulses of excitation signals V1 and V2 due to variations in finger touch pressure on that surface 5 (and other "environmental" parameters), (3) cancel the effects of variations in finger touch pressure, etc., on the peak amplitudes of the pulses or bursts of pulses of excitation signals V1 and V2, and (4) compute the above-mentioned ratio X of corrected peak amplitude of each V1 pulse or burst of pulses and the next V2 pulse or burst of pulses. The ratio X then may be used to determine the location x of the corresponding finger touch. The foregoing measuring, digitizing, and cancellation process is performed on a continuous basis.

Figure 4:
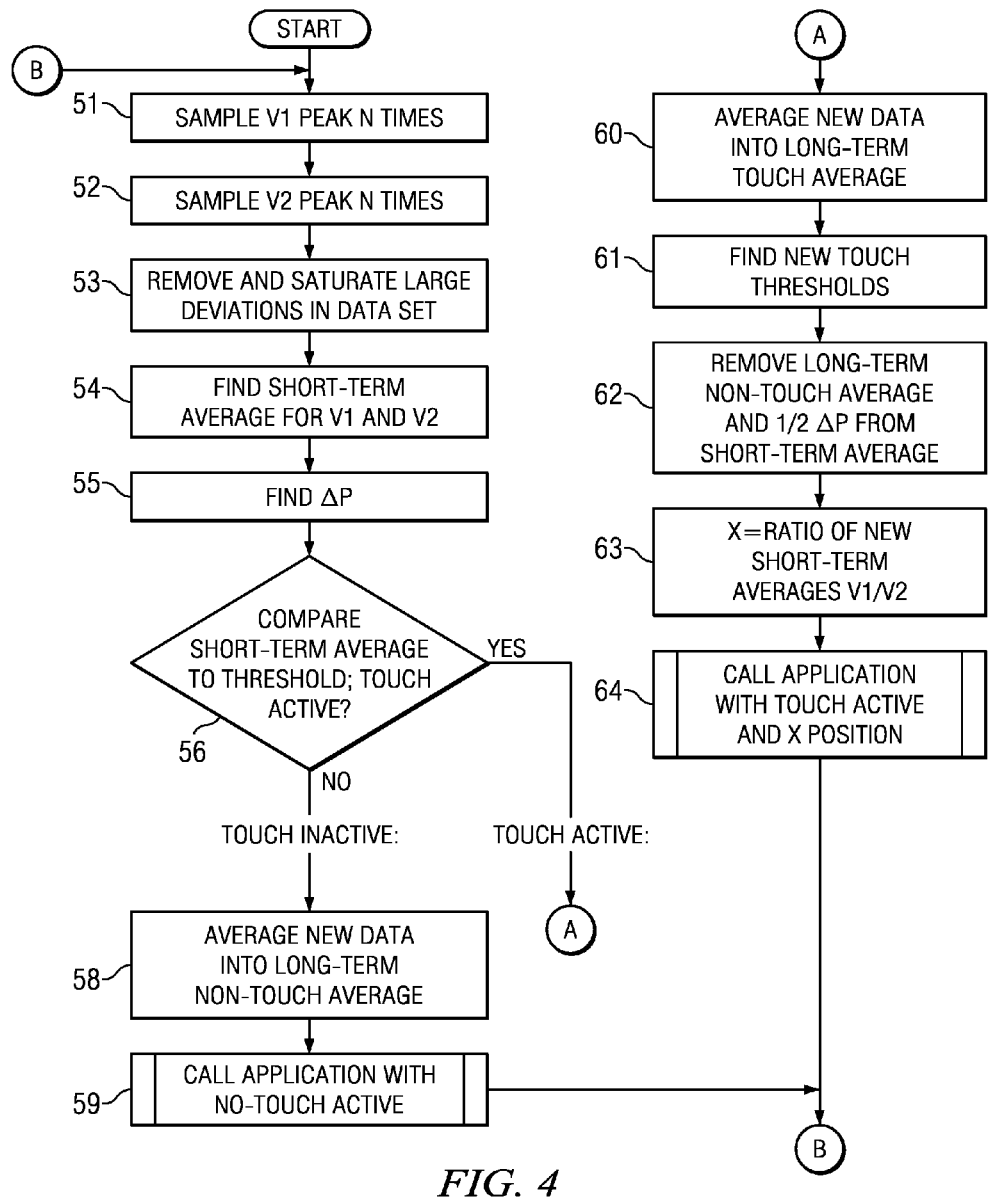
FIG. 4 is a flowchart that illustrates an algorithm performed by the processor in block 32 of FIG. 2A.

The algorithm of FIG. 4 executed by processor 32 utilizes the digitized peak amplitude data $D_{OUT}$ to compute finger touch pressure changes $\Delta P$, which are indicated on the V13' waveform in FIG. 2B to compute the ratios of the detected peaks of the V1 and V2 burst signals which represent the present finger touch location x. (Note that $\Delta P$ usually represents mainly variations in the amplitude of the detected peak signal V13 due to variations in finger touch pressure, but also includes variations in the amplitude of the detected peak signal V13 due to certain variations in certain other environmental parameters.) Averaging the values of the digitized peak amplitude data eliminates electrical noise.

Referring to FIG. 4, the program/algorithm executed by processor 32 in FIG. 2A samples the peak values of the V1 bursts of pulses a predetermined number N of times and then also samples the peak values of the subsequent non-overlapping V2 bursts a predetermined number N of times, as indicated in blocks 51 and 52, respectively. The algorithm then goes to block 53 and removes and thereby "saturates" large deviations in the V1 and V2 data set sampled in accordance with blocks 51 and 52, by limiting certain sampled V1 and V2 values that are too large (due for example, to noise that has been injected into the data set). When that happens, the samples that are at or near a maximum value or a minimum value are omitted and are not used in the averaging process. Then, in accordance with block 54, the algorithm uses the data from the process of block 53 to compute a short-term average of the sampled peak values of V1 and V2. Next, the algorithm goes to block 55 and calculates values of $\Delta P$, where $\Delta P$ represents increments of finger touch pressure and is illustrated in the V13' waveform in FIG. 2B. (After the "saturated" values have been omitted, the smallest sample is subtracted from the largest to obtain $\Delta P$.)

Next, the algorithm goes to decision block 56 and compares the foregoing short-term average of V1 and V2 to a present value of a touch threshold level. If the comparison indicates that the short term average exceeds the touch threshold level, the decision is affirmative and indicates that the present touch is "active". Otherwise, the decision is negative and indicates that the present touch is "inactive". If the present touch is inactive, the algorithm goes to block 58 and averages the new data resulting from the process of block 54 with the previous value of a "long-term non-touch average. The algorithm then goes to block 59 and generates an interrupt signal which is sent to the user application, with the touch status inactive.

If the current touch status is active, the algorithm goes to block 60 and averages the new data resulting from the process of block 54 with a previous "long-term touch average". The "long term non-touch average" is a number which indicates that the sensor is not activated, in which case the capacitive coupling will be low and the number will be small and slowly increasing and decreasing. This occurs because there will be some environmental variables that change and cause this value to increase or decrease. For example, as the humidity increases, the long term non-touch average value will increase. The sensor does not interpret this increasing value as a touch. The long term non-touch average has a very long time constant and changes very slowly. The "long term touch average" is a number which indicates that the sensor is activated. It tracks the short term average calculated in block 54, with a longer time constant. There are two of these averages, one for the V1 interval and one for the V2 interval.

The algorithm then goes to block 61 and computes new touch threshold levels. To calculate the touch threshold, the long term non-touch average is added to the ΔP value and increased by a small offset. Then the algorithm goes to block 62 and removes both the previously mentioned long-term non-touch average value and the value (ΔP) from the short term average of block 54, in order to obtain the X ratio. To accomplish this, the long term non touch average is subtracted from the sum of the short term and long term averages and one half of −ΔP. This removes the environmental factors and some noise. The numerator and dominator are treated the same and form the X ratio. The algorithm then goes to block 63 and computes the ratio X of the present touch. The algorithm then goes to block 64 and calls a "touch active" routine, generating an interrupt signal which is sent to the user application along with the X position data.

The ratio X of the stored amplitude data generated in response to any V1 burst and the next V2 burst is proportional to the x location of the corresponding touch. The finger touch pressure change ΔP (and changes in certain environmental parameters) equally affect the above-mentioned stored amplitude data that is generated in response to any V1 burst and the next V2 burst.

Once computed, the values of the ratio X for the present finger touch location x, the present direction of movement of the finger touch location, and the presence or absence of any finger touch may be decoded to provide a unique linear signal that may represent pressing of a button switch or a slider at that particular point. Such information also may be segmented and decoded by processor 32 to simulate various individual control button presses or a linear control signal such as a volume control signal. Relatively long-duration or long term average peak values represented by V13 can be used to indicate the presence or absence of a touch on touch surface 5.

Figure 1:
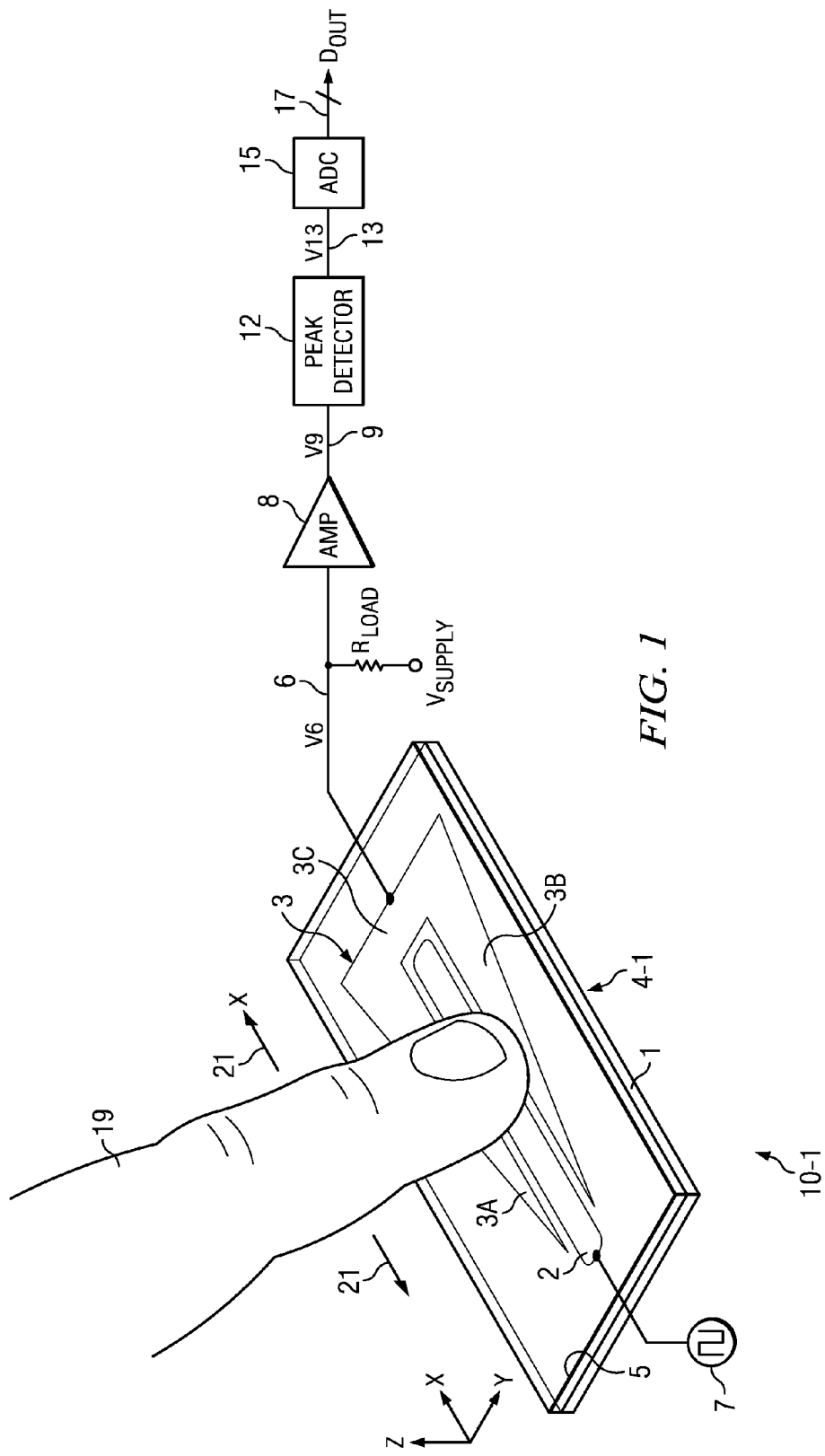
FIG. 1 is diagram of a linear capacitively-coupled touch sensor system.

Thus, FIG. 2A demonstrates a ratiometric configuration of two "partial sensors" 3A,2 and 3B,2 that share center plate 2 as a common element, wherein the first partial sensor comprised of outer plate 3A and inner plate 2 increases the capacitive coupling as the touch input moves from left to right at the same time the second partial sensor comprised of outer plate 3B and inner plate 2 decreases the capacitive coupling. Touch sensor 4-2 in FIG. 2A differs structurally from touch-sensor 4-1 in FIG. 1 in such a way as to provide the ratiometric coupling between inner plate 2 and outer plates 3A and 3B, respectively. This structural difference along with the alternate excitation of outer plates 3A and 3B enables variations of amplifier output voltage V9 and peak detector output voltage V13 due to variations in finger touch pressure and various other environmental parameters to be determined and then eliminated or canceled from the stored amplitudes used to compute the ratio representing the value of x which represents the present finger touch location.

Figure 3:
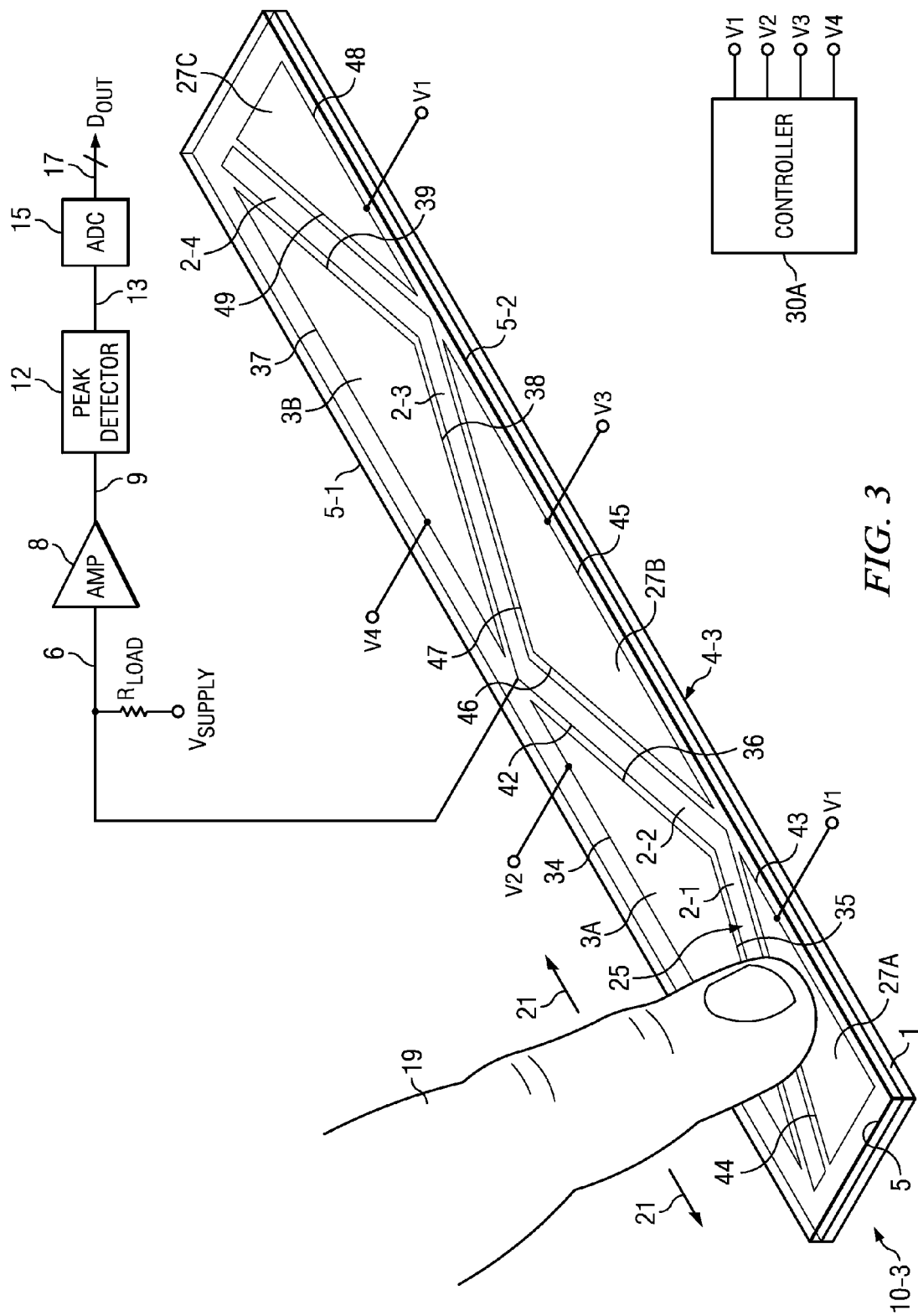
FIG. 3 is a diagram of another embodiment of a linear capacitively-coupled touch sensor system of the present invention.

FIG. 3 shows an implementation of a capacitively-coupled touch sensor system 10-3 which includes a capacitively-coupled sensor 4-3 that is a "stretched out" version of touch sensor 4-2 of FIG. 2A. Touch sensor system 10-3 of FIG. 3 also eliminates the effect of variations in finger touch pressure and other environmental parameters on the amplitude of an output signal that represents the finger touch location in basically the same way as sensor system 10-2 of FIG. 2A. In FIG. 3, capacitively-coupled touch sensor 4-3 includes five elongated, triangular outer plates 27A, 3A, 27B, 3B, and 27C and a center plate 2 which includes four segments 2-1, 2-2, 2-3, and 2-4 arranged in a zig-zag fashion. Outer plates 3A and 3B are located on one side of center plate 2, and outer plates 27A, 27B, and 27C are located on the other side of center plate 2.

Base edge 34 of outer plate 3A is aligned with base edge 37 of outer plate 3B. Edge 35 of outer plate 3A is parallel to and spaced from a first edge of center plate segment 2-1, and edge 36 of outer plate 3A is parallel to and spaced from a first edge of center plate segment 2-2. Similarly, edge 38 of outer plate 3B is parallel to and spaced from a first edge of center plate segment 2-3, and edge 39 of outer plate 3B is parallel to and spaced from a first edge of center plate segment 2-4.

Base edge 43 of outer plate 27A is aligned with base edges 45 and 48 of outer plates 27B and 27C. Edge 44 of outer plate 27A is parallel to and spaced from a second edge of center plate segment 2-1, and edge 46 of outer plate 27B is parallel to and spaced from a second edge of center plate segment 2-2. Similarly, edge 47 of outer plate 27B is parallel to and spaced from a second edge of center plate segment 2-4, and edge 49 of outer plate 27C is parallel to and spaced from a second edge of center plate segment 2-4. Each of outer plates 3A and 3B is spaced from a first side of center plate 2 by a first narrow gap, and each of outer plates 27A, 27B, and 27C by a second narrow gap.

A controller 30A generates non-overlapping excitation signals V1, V2, V3, V4. V1 is applied to outer plates 27A and 27C. V2 is applied to outer plate 3A, V3 is applied to outer plate 27B, and V4 is applied to outer plate 3B.

As the tip of a user's finger 19 slides in either direction along segment 2-1 of the center plate 2 of touch sensor 4-3, the amount of capacitive coupling from one of plates 3A and 27A to center plate 2 increases as the width of that plate 3A or 27A increases. Simultaneously, the amount of capacitive coupling from the other of these two plates decreases as its width decreases. With the finger touch located over the left end of segment 2-1 of center plate 2, there is minimal capacitive coupling between center plate 2 and outer plate 3A and maximum capacitive coupling between center plate 2 and outer plate 27A. Conversely, at the right end of segment 2-1 of center plate 2, there is minimal capacitive coupling between center plate 2 and outer plate 27A and maximum capacitive coupling between center plate 2 and outer plate 3A.

Similarly, as the tip of the user's finger 19 slides in either direction along segment 2-2 of center plate 2 of touch sensor 4-3, the amount of capacitive coupling from one of plates 3A and 27A to center plate 2 increases as the width of that plate 3A or 27A increases. Simultaneously, the amount of capacitive coupling from the other of these two plates decreases as its width decreases. With the finger touch located over the left end of segment 2-2 of center plate 2, there is minimal capacitive coupling between center plate 2 and outer plate 27B and maximum capacitive coupling between center plate 2 and outer plate 3A. Conversely, at the right end of segment 2-2 of the center plate 2, there is minimal capacitive coupling between center plate 2 and outer plate 3A and maximum capacitive coupling between center plate 2 and outer plate 27B.

Operation is essentially the same as the tip of the user's finger 19 slides in either direction along segments 2-3 and 2-4 of center plate 2.

Thus, the amount of capacitive coupling of each of non-overlapping excitation signals V1, V2, V3, and V4 to center plate 2 is different for each value of the location x at which finger 19 presses against the touch surface insulative layer 5.

As in FIG. 2A, center plate 2 is connected by a conductor 6 to one terminal of a resistor $R_{LOAD}$ and to the input of an amplifier 8. The signal V6 is produced on conductor 6 as a result of sequential capacitive coupling of non-overlapping excitation signals V1, V2, V3, and V4 onto center plate 2. Amplifier 8 amplifies V6 to produce a signal V9 that is applied by conductor 9 to one input of peak detector circuit 12. Peak detector circuit 12 produces detected peak signal V13, which is applied by conductor 13 to the input of an ADC 15. The output 17 of ADC 15 may go to a processor which executes an algorithm that is basically the same as the algorithm of FIG. 4 executed by the processor in FIG. 2A.

The present invention thus provides a single ratio-metric coupled sensor that operates with as few as three signals but nevertheless provides an output signal value which is proportional to the position of the user's touch and which requires relatively little computing hardware and software to obtain a linear response from the user's sliding finger touch. In contrast, to implement a slider function with prior art capacitively-coupled touch systems, several individual capacitively-coupled sensors are required, and a relatively large amount of interpolation software and digital computing capability are required to interpolate a linear position in response to a user's touch.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, the variation in the width of outer plates 3A and 3B as a function of x may be different than the "triangular" variation shown in FIGS. 2A and 3 and may result in the computed values of x which are a nonlinear function of the user's actual finger position. In some cases it may be practical to provide the center conductor of the touch sensor with a circular or arcuate axis so that the user touch would need to traverse the circular or arcuate axis.

Also, an element other than a human finger, e.g., a robotic element, can be utilized to perform a touch, as long as the element sufficiently influences the capacitive coupling between each outer plate and the center plate 2. Furthermore, the finger or other element need not actually touch the touch surface 5 as long as it is sufficiently close to the outer plates and the inner plate to sufficiently influence the capacitive coupling between them. In some cases, peak detector 12 could be omitted and the peak detecting function could be performed by a sufficiently fast ADC and processor.

What is claimed is:

1. A touch sensing system comprising:
   (a) a capacitively-coupled touch sensor including
      1) a first conductive layer disposed on a first insulative layer and having a generally uniform width along an axis, and
      2) a second conductive layer disposed on the first insulative layer and having a generally non-uniform width that varies progressively along a first direction of the axis, a first edge of the first conductive layer being spaced from the second conductive layer by a first narrow gap;
   (b) stimulus circuitry for applying a first excitation signal to a first one of the first and second conductive layers;
   (c) first circuitry amplifying a first signal capacitively coupled through a touch element from one of the first and second conductive layers to another of the first and second conductive layers to produce an amplified signal; and
   (d) second circuitry for processing digitized peak values of the amplified signal to compute a value representative of a location of the touch element generally along the axis;
   wherein the width of the second conductive layer increases progressively along the first direction of the axis, the touch sensing system including a third conductive layer disposed on the first insulative layer and having a generally non-uniform width that progressively decreases along the first direction of the axis, a second edge of the first conductive layer opposite to the first edge thereof being spaced from the third conductive layer by a second narrow gap, wherein the stimulus circuitry applies the first excitation signal to the second conductive layer and also applies a second excitation signal to the third conductive layer;
   wherein the first and second excitation signal signals are non-overlapping signals, and wherein each of the first and second excitation signal signals consists of a plurality of bursts of pulses;
   wherein the touch element is a tip of a user's finger;
   wherein the touch sensing system includes a peak detector for detecting peaks of the amplified signal produced in response to the first and second excitation signals and a first analog-to-digital converter for digitizing the detected peaks corresponding to the first and second excitation signals, wherein the second circuitry processes the digitized detected peaks by:
      (1) sampling the digitized peak values corresponding to the first excitation signal a predetermined number of times;
      (2) removing large-deviation samples from the sampled digitized peak values;
      (3) determining a short term average of the sampled digitized peak values corresponding to each of the first and second excitation signals, respectively;
      (4) determining an amount of variation in the short term averages over a predetermined interval;
      (5) averaging the short-term average of the sampled peak values corresponding to the first and second excitation signals into a long-term touch average if a present touch is active;
      (6) computing the value representative of a location of the touch element generally along the axis; and
      (7) repeating operations (1) through (6).

2. The touch sensing system of claim 1 wherein at least a portion of the axis is straight line.

3. The touch sensing system of claim 1 wherein the first circuitry also performs a signal conditioning function.

4. The touch sensing system of claim 1 including a second insulative layer disposed over the first and second conductive layers.

5. The touch sensing system of claim 1 wherein the first circuitry includes a second analog-to-digital converter for providing a digitized representation of the amplified signal.

6. The touch sensing system of claim 1 wherein the second circuitry processes the digitized detected peaks by comparing the short term average of the sampled digitized peak values to a predetermined touch threshold to determine if the present touch is active, and if the present touch is active, determining new touch thresholds based on the long-term touch average, and removing the long-term non-touch average and one half of the variation from the short-term average before proceeding to step (6).

7. The touch sensing system of claim 6 wherein if the present touch is not active, the second circuitry processes the digitized detected peaks by averaging the short term average of the sampled peak values corresponding to the first and second excitation signals into a long-term non-touch average.

8. The touch sensing system of claim 1 wherein the first conductive layer includes
  first, second, and third third sections each having a first edge and an opposite second edge,
  third, fourth, and fifth conductive layers being disposed on the first insulative layer along the first conductive layer and having generally non-uniform widths that vary progressively along the first direction of the axis,
  the second conductive layer being spaced by the first narrow gap from the second edge of the first section,
  the third conductive layer being spaced by a second narrow gap from the second edge of the first section and having a width that varies oppositely to the width of the second conductive layer,
  the third conductive layer being spaced by a third narrow gap from the first edge of the second section,
  the fourth conductive layer being spaced by a fourth narrow gap from the first edge of the second section and having a width that varies oppositely to the width of the third conductive layer along the third narrow gap,
  the fifth conductive layer being spaced by a fifth narrow gap from the second edge of the third section,
  the fourth conductive layer being spaced by a sixth narrow gap from the second edge of the third section having a width that varies oppositely to the width of the fifth conductive layer along the fifth narrow gap,
  wherein the stimulus circuitry applies the first excitation signal to the second conductive layer, applies a second excitation signal to the third conductive layer, applies a third excitation signal to the fourth conductive layer, and applies a fourth excitation signal to the fifth conductive layer, the first, second, third, and fourth excitation signals being non-overlapping.

9. The touch sensing system of claim 8 wherein the first conductive layer includes a fourth section having a first edge and an opposite second edge, the touch sensing system including a sixth conductive layer, the fifth conductive layer being spaced by a seventh narrow gap from the first edge of the fourth section, the sixth conductive layer being spaced by an eighth narrow gap from the second edge of the fourth section having a width that varies oppositely to the width of the fifth conductive layer along the seventh narrow gap, wherein the stimulus circuitry applies the first excitation signal to the sixth conductive layer.

10. A method for operating a touch sensing system, comprising:

(a) providing a capacitively-coupled touch sensor including a first conductive layer disposed on a first insulative layer and having an axis and a second conductive layer disposed on the first insulative layer and having a generally non-uniform width that varies progressively along a first direction of the axis, a first edge of the first conductive layer being spaced from the second conductive layer by a first narrow gap;

(b) applying a first excitation signal to a first one of the first and second conductive layers;

(c) amplifying a first signal capacitively coupled through a touch element from the first one of the first and second conductive layers to a second one of the first and second conductive layers to produce an amplified signal; and (d) processing digitized peak values of the amplified signal to compute a value representative of a location of the touch element along the axis;

(e) providing a third conductive layer disposed on the first insulative layer and having a generally non-uniform width that varies oppositely to the second conductive layer along the first direction of the axis, a second edge of the first conductive layer opposite to the first edge thereof being spaced from the third conductive layer by a second narrow gap, (f) applying the first excitation signal to the second conductive layer (g) applying a second excitation signal to the third conductive layer, wherein the second direction is opposite to the first direction, and wherein the first and second excitation signals are non-overlapping signals, and wherein each of the first and second excitation signals consists of a plurality of bursts of pulses;

wherein the touch element is a finger, the method including
  (1) sampling the digitized peak values corresponding to the first excitation signal a predetermined number of times;
  (2) removing large-deviation samples from the sampled digitized peak values:
  (3) determining a short term average of the sampled digitized peak values corresponding to the first and second excitation signals, respectively;
  (4) determining an amount of variation in finger pressure on a second insulative layer over the first, second, and third conductive layers;
  (5) averaging the short-term average of the sampled peak values corresponding to the first and second excitation signals into a long-term touch average if a present touch is active;
  (6) computing the value representative of a location of the touch element generally along the axis; and
  (7) repeating steps (1)-(6).

* * * * *